(12) United States Patent
Iwai et al.

(10) Patent No.: US 7,907,653 B2
(45) Date of Patent: Mar. 15, 2011

(54) VERTICAL CAVITY SURFACE EMITTING LASER DEVICE AND VERTICAL CAVITY SURFACE EMITTING LASER ARRAY

(75) Inventors: Norihiro Iwai, Tokyo (JP); Keishi Takaki, Tokyo (JP); Suguru Imai, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 40 days.

(21) Appl. No.: 12/388,057

(22) Filed: Feb. 18, 2009

(65) Prior Publication Data
US 2009/0304036 A1 Dec. 10, 2009

(30) Foreign Application Priority Data

Feb. 20, 2008 (JP) ................................ 2008-038315

(51) Int. Cl.
*H01S 3/10* (2006.01)
*H01S 5/00* (2006.01)
*H01S 3/08* (2006.01)
(52) U.S. Cl. ...................... 372/45.01; 372/96; 372/22
(58) Field of Classification Search ............... 372/45.01, 372/96, 22
See application file for complete search history.

(56) References Cited

U.S. PATENT DOCUMENTS

| 5,594,751 | A * | 1/1997 | Scott ..................... 372/46.013 |
| 6,618,414 | B1 * | 9/2003 | Wasserbauer et al. ..... 372/45.01 |
| 7,256,417 | B2 * | 8/2007 | Mawst et al. ................ 257/14 |
| 2003/0026303 | A1 * | 2/2003 | Ouchi ........................... 372/36 |

* cited by examiner

*Primary Examiner* — Minsun Harvey
*Assistant Examiner* — Patrick Stafford
(74) *Attorney, Agent, or Firm* — Turocy & Watson, LLP

(57) ABSTRACT

In the surface emitting laser, low threshold electric current and high-power output are achieved while maintaining single mode characteristics. The surface emitting laser comprises a layered structure formed on a GaAs substrate 10 is comprised of: a semiconductor lower DBR mirror 12, a cladding layer 14, a n-type contact layer 16, an active layer 18, an electric current constricting layer 20, a p-type cladding layer 22, a p-type contact layer 24, a phase adjusting layer 36 and a dielectric upper DBR mirror 28.

The surface emitting laser should be formed such that the diameter X (μm) of the opening diameter of the previously mentioned electric current constricting layer 20 and diameter Y (μm) of the phase adjusting layer satisfy the following relation:

$X+1.9\lambda \leq Y \leq X+5.0\lambda$ (wherein $\lambda$ indicates oscillation wavelength (μm) of the surface emitting laser).

6 Claims, 7 Drawing Sheets

VERTICAL CAVITY SURFACE EMITTING LASER DEVICE AND VERTICAL CAVITY SURFACE EMITTING LASER ARRAY

CROSS REFERENCE TO RELATED APPLICATIONS

This application claims priority from a Japanese patent application serial No. 2008-038315 filed on Feb. 20, 2008, the entire content of which is incorporated herein by reference.

BACKGROUND OF THE INVENTION

1. Field of the Invention

The present invention relates to surface emitting laser and surface emitting laser array, and in particular, to the structure of surface emitting laser which includes phase adjusting layer and electric current constricting layer.

2. Description of the Related Art

As the name suggests, in VCSEL (Vertical Cavity Surface Emitting Laser, hereinafter simply referred to as "surface emitting laser") elements, the direction in which light resonates is perpendicular to the substrate surface and they are brought to attention in various applications like optical interconnection, a light source for communication, and sensors etc. This is because, as compared to the conventional edge emitting semiconductor laser, two-dimensional array of the laser element can be created more easily, the testing can be done at wafer level as cleavage is not required for creating the mirror, oscillation can be done with an extremely small threshold due to the active layer volume being very small, and the power consumption is small.

In the surface emitting laser having a relatively long oscillation wavelength of 1100 to 1550 nm bandwidth, it is challenging to improve the characteristics like performing a high-power operation at a high temperature while maintaining the electric current with a low threshold in a single mode. This especially is challenging in the surface emitting laser having an oscillation wavelength of 1300 to 1550 nm bandwidth.

A structure that causes reduction in losses in the intra-cavity structure has been proposed in the U.S. Pat. No. 6,618,414 (hereinafter referred to as "the patent reference"). In the structure that is proposed, a phase adjusting layer (referred to as "spacer layer" in the patent reference) has been created between the contact layer comprising a semiconductor layer and a dielectric DBR (Distributed Bragg Reflector) mirror that configures the upper reflecting mirror forming one side of a resonator. By using this structure, nodes of standing wave of light is adjusted with the position of the spacer layer, and light absorption at the heavily doped contact layer is suppressed to the minimum, and thereby, a high-power operation at a high temperature while maintaining the electric current with a low threshold is achieved.

In the patent reference in which the surface emitting laser structure having such dielectric DBR mirror and phase adjusting layer is proposed, although high-power operation is achieved at a high temperature while maintaining the electric current with a low threshold, investigation is insufficient regarding the single mode characteristics, and there is no description in particular regarding the relation to be maintained between the phase adjusting layer and the electric current constricting layer to be created. In other words, conventionally, there was no knowledge regarding the relation to be maintained between the phase adjusting layer and the electric current constricting layer with respect to the single mode characteristics, in the structure in surface emitting lasers described in the patent reference. The present inventors realized that the relation between both these layers are important in determining the single mode characteristics and we were successful in manufacturing a surface emitting laser having practical oscillation characteristics.

SUMMARY OF THE INVENTION

It is an object of the present invention to at least partially solve the problems in the conventional technology.

In a surface emitting laser in accordance with an aspect of the invention, a layered structure comprising a lower DBR mirror, a lower cladding layer, an active layer, an upper cladding layer, an electric current constricting layer, a phase adjusting layer and an upper DBR mirror is deposited on a substrate, wherein the relation between the opening diameter X (μm) of the current constricting layer and diameter Y (μm) of the phase adjusting layer is as follows:
$X+1.9\lambda \leq Y \leq X+5.0\lambda$ (wherein, $\lambda$ indicates oscillation wavelength (μm) of the surface emitting laser).

The above and other objects, features, advantages and technical and industrial significance of the present invention will be better understood by reading the following detailed description of presently preferred embodiments of the invention, when considered in connection with the accompanying drawings.

DETAILED DESCRIPTION OF THE PREFERRED EMBODIMENTS

Embodiments of the present invention is described referring with the drawings. While describing the embodiments, similar parts are assigned similar symbols and duplicate explanation is omitted.

First Embodiment

Figure 1:
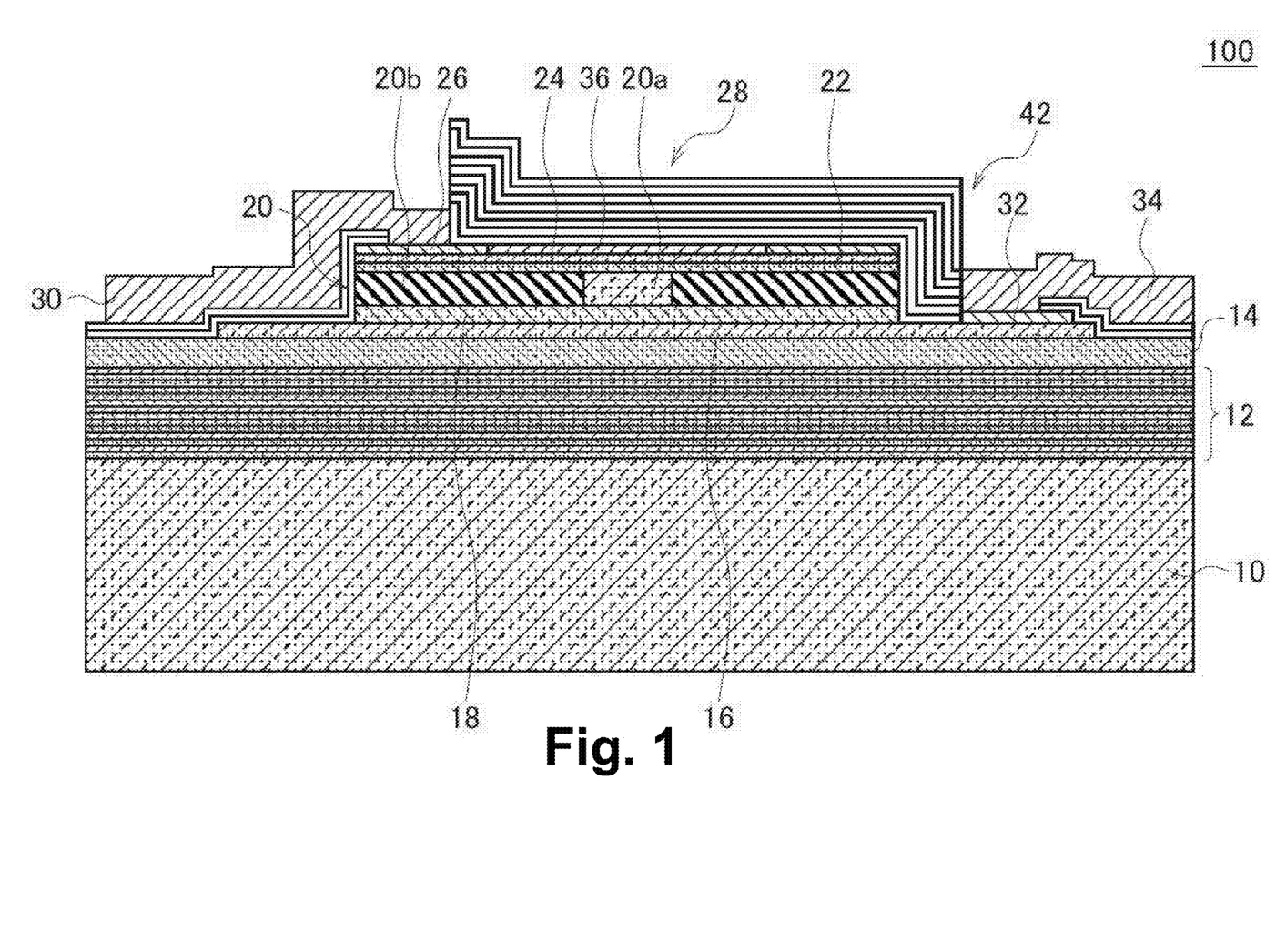
FIG. 1 is a cross-section diagram of the surface emitting laser according to an embodiment of the present invention.

In the following, embodiments of the present invention are described referring to the drawings. FIG. 1 is a cross-section diagram of the surface emitting laser according to an embodiment of the present invention. The surface emitting laser 100 comprises GaAs substrate 10 and a layered structure which is deposited on the GaAs substrate and a part which is formed in the mesa post 42. When viewed from the GaAs substrate 10, a layered structure sequentially consists of: a lower DBR mirror 12 comprising multi-layered semiconductor films, a cladding layer 14, a lower contact layer 16, an active layer 18 which has quantum well structure (includes upper and lower SCH layer), an electric current constricting layer 20, a p-type cladding layer 22, a p-type (p+) contact layer 24, a ring-shaped p-side electrode 26 that encloses the phase adjusting layer 36, and an upper DBR mirror 28 comprised of dielectric multi-layer. The surface emitting laser according to the present embodiment forms the active layer structure and the resonator structure such that the oscillation wavelength is 1300 nm.

In the above-mentioned layered structure, mesa post is comprised of removing the outer portion of the upper DBR mirror 28, the p-side electrode 26 including the phase adjusting layer 36, the p-type contact layer 24, the p-type cladding layer 22 and the electric current constricting layer 20, and until the active layer 18. The p-side electrode 26 is lead to the outer side of mesa post via the p-side extracting electrode 30 and connected to an external power supply source. The n-side electrode 32 is formed on the surface that is exposed on the outer side of the mesa post of the lower contact layer 16, and the n-side electrode 32 is lead to the outer side via the n-side extracting electrode 34 and connected to an external power supply source.

Figure 2:
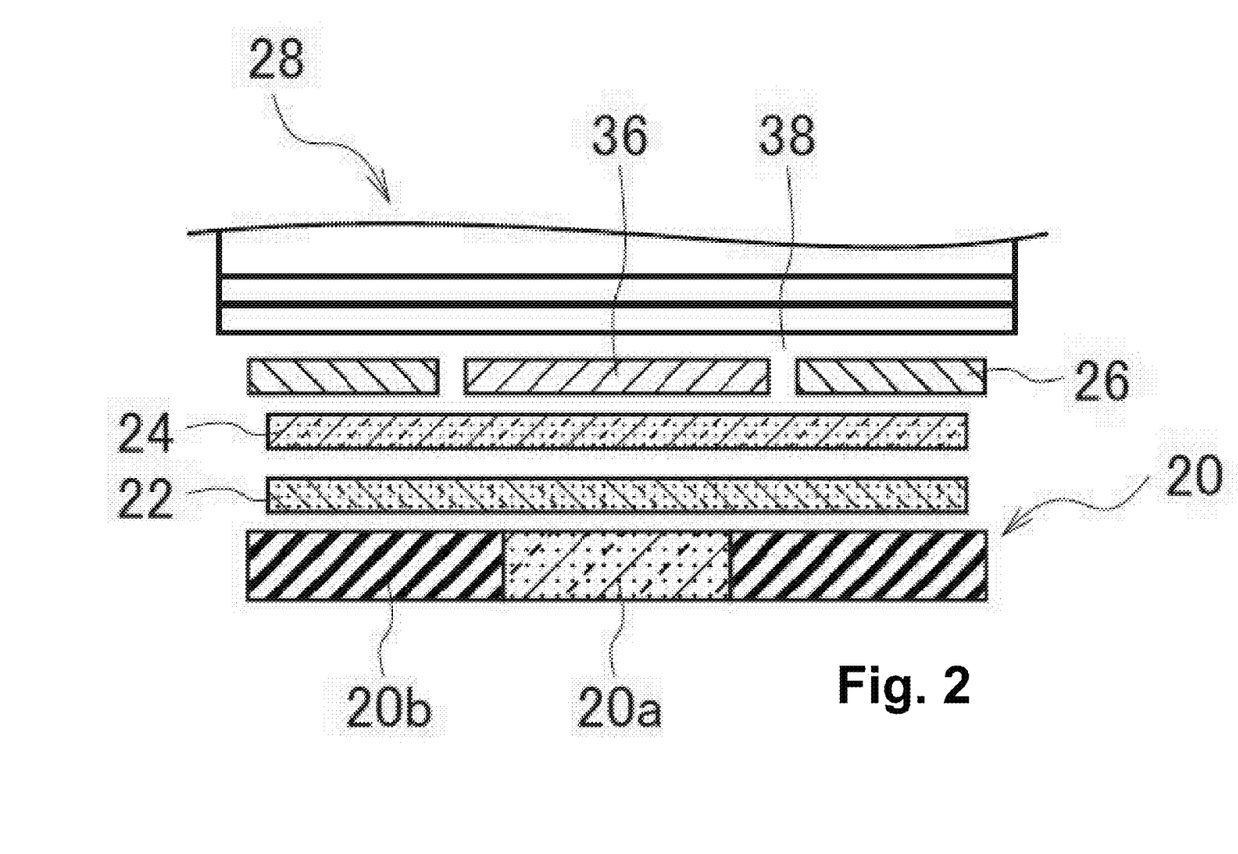
FIG. 2 is a cross-section diagram which shows the details in the vicinity of the electric current constricting layer and phase adjusting layer of the surface emitting laser in FIG. 1.

FIG. 2 describes the details in the vicinity of the electric current constricting layer and the phase adjusting layer in the above surface emitting laser. The electric current constricting layer 20 is configured as Al oxidized constricting layer and is comprised of oxidized region 20b that configures electric current blocking region on the outer side and an opening (electric current opening) 20a that configures the electric current passing region in the center side. The Al oxidized constricting layer 20 is formed as, for example, $Al_{0.98}Ga_{0.02}As$ layer, and after the layered portion is formed into mesa post 42, by means of the thermal oxidization method in which water vapor is used from the outer side of the mesa post 42, the electric current blocking region 20b is formed by oxidizing only the outer perimeter, and the central portion becomes the electric current opening 20a. The electric current constricting layer 20 is placed in the lowest position (hereinafter referred to as "the node of standing wave") of the light intensity amplitude for standing wave of light (or its vicinity), it does not contribute to the optical confinement nearly at all and functions only as an electric current constricting structure. The electric current constricting structure is not limited to oxidized constricting layer, and can be formed by ion-implantation technique, embedded tunnel junction structure etc. In particular, oxidized constricting structure is preferred in the surface emitting laser comprised of GaAs material formed on GaAs substrate, and an embedded tunnel junction structure is preferred in the surface emitting laser comprising InP material formed on the InP substrate. The structure for blocking electric current by means of ion-implantation technique can be used with each of the two methods mentioned above. In this case, the parasitic capacity outside the mesa can be reduced and high-speed operation becomes possible.

The phase adjusting layer 36 is comprised of SiN layer deposited inside the ring shaped p-side electrode 26. Composition with refractive index around 1.8 to 2.5 is used for the SiN layer. A small gap 38 is formed between the p-side electrode 26 and the phase adjusting layer 36. This gap 38 measures around 0.5 to 3 μm and it can be adjusted by the photolithographic method. The $SiO_2$ layer which is the lowermost layer of the dielectric film of the upper DBR mirror 28 is deposited on the phase adjusting layer 36 and the p-side electrode 26. The upper DBR mirror 28 is comprised of dielectric multi-layered film reflecting mirror on which the pair of layers consisting of $SiN_x$ layer and $SiO_2$ layer is deposited. This $SiO_2$ layer is created by filling the gap 38 between the p-side electrode 26 and the phase adjusting layer 36. Thereafter, the pair layer comprised of the high refractive index layer/low refractive index layer is stacked by multiple sequential pairs thus creating the upper DBR mirror 28. If the upper DBR mirror is comprised of a high refractive index layer consisting of SiN layer having a refractive index of 2.1 and a low refractive index layer consisting of $SiO_2$ layer having a refractive index of 1.46, approximately 10 to 13 pairs are formed. However, the number of pairs is suitably adjusted based on the difference between the refractive indices of the high refractive index layer and the low refractive index layer and the desired laser characteristics. The material that configures the upper DBR mirror is not limited to $SiN/SiO_2$, and AlO, amorphous silicon etc. may be suitably combined.

By properly setting the thickness of the p-type contact layer 24 on the lower layer side, the phase adjusting layer 36 is created in the topmost position (hereinafter referred to as "antinode of standing wave") or in the vicinity of the light intensity amplitude for standing wave as a part of the resonator. The phase adjusting layer 36 has a lower refractive index than the layers 24, 22 and 20a which lie below it and has a higher refractive index than the $SiO_2$ layer adjoining the phase adjusting layer 36 in the lamination surface (in the surface parallel to the substrate) and functions as an optical confinement structure. By positioning the phase adjusting layer 36 at the antinode of standing wave of light, the optical confinement can be performed based on the difference in refractive index with the $SiO_2$ layer formed in the gap 38 between the p-side electrode 26 and the phase adjusting layer 36.

In the present embodiment, regarding the surface emitting laser 100 that has the above-mentioned structure, the threshold electric current, side mode suppression ratio and slope efficiency of its laser oscillation was paid attention, and an experiment was performed for optimizing the relationship between the diameter of the diameter of the phase adjusting layer 36 and the diameter of the electric current opening (oxidization opening) 20a of the oxidized constricting layer 20. For the experiment, initially multiple laser elements were created in which the diameter of the oxidization opening 20a was fixed to 6 μm and the diameter of the phase adjusting layer 36 was 6.5, 8.5, 9.5, 12.0, 12.5 and 15.0 μm, respectively, and the characteristics were measured for these elements. Regarding the multiple laser elements in which the diameter of the oxidization opening 20a are 2.5, 4.5, 5.0, 6.0 and 8.5 μm, respectively, laser elements were created in which the diameter of the phase adjusting layer 36 is larger than the diameter of the oxidization opening 20a by 4.0 μm and the electric current—light output characteristic and spectrum were measured.

Figure 3:
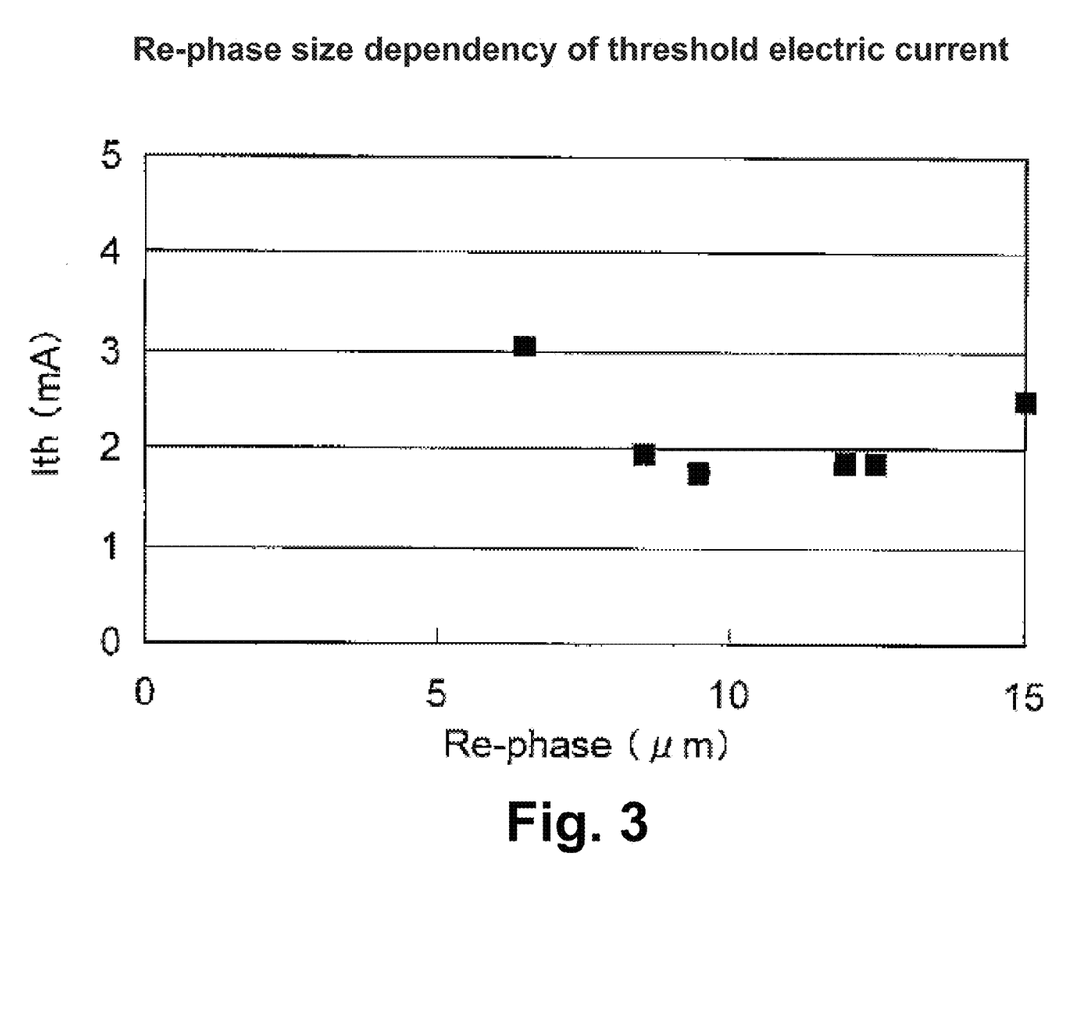
FIG. 3 is a graph which indicates the dependence of the threshold electric current of the surface emitting laser shown in FIG. 1, on the diameter of the phase adjusting layer.
Figure 4:
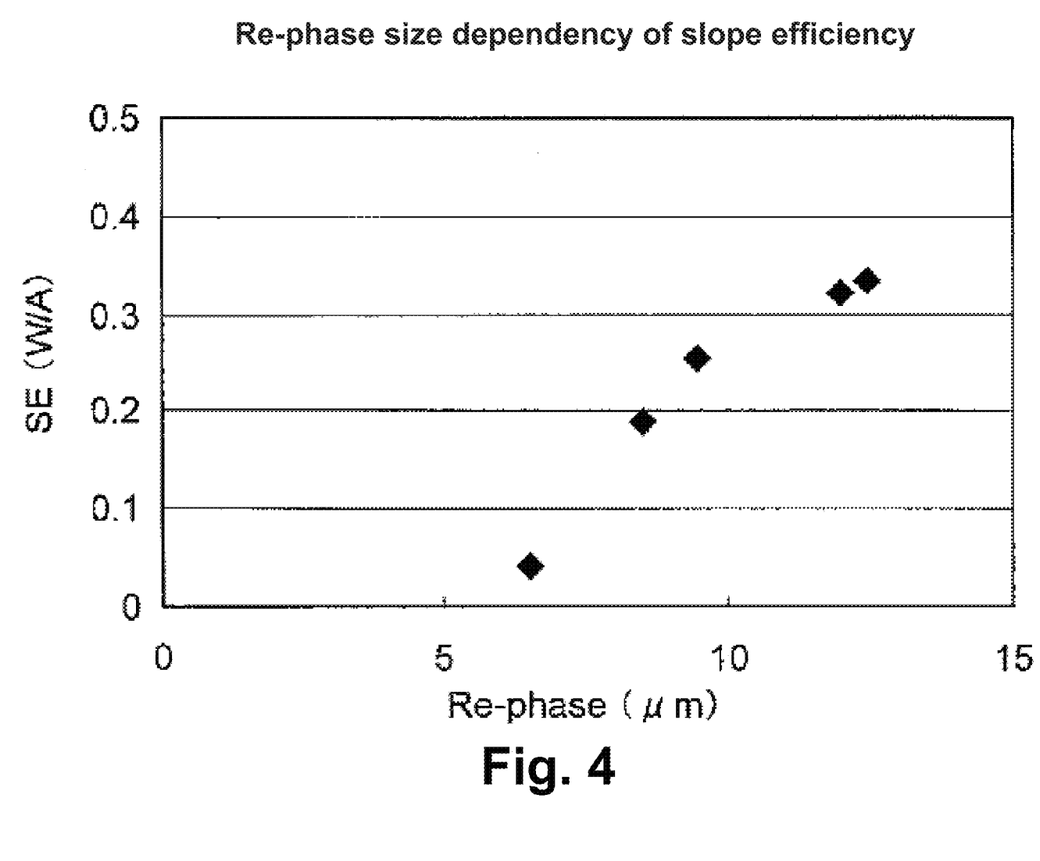
FIG. 4 is a graph which indicates the dependence of the slope efficiency of the surface emitting laser shown in FIG. 1, on the diameter of the phase adjusting layer.
Figure 5:
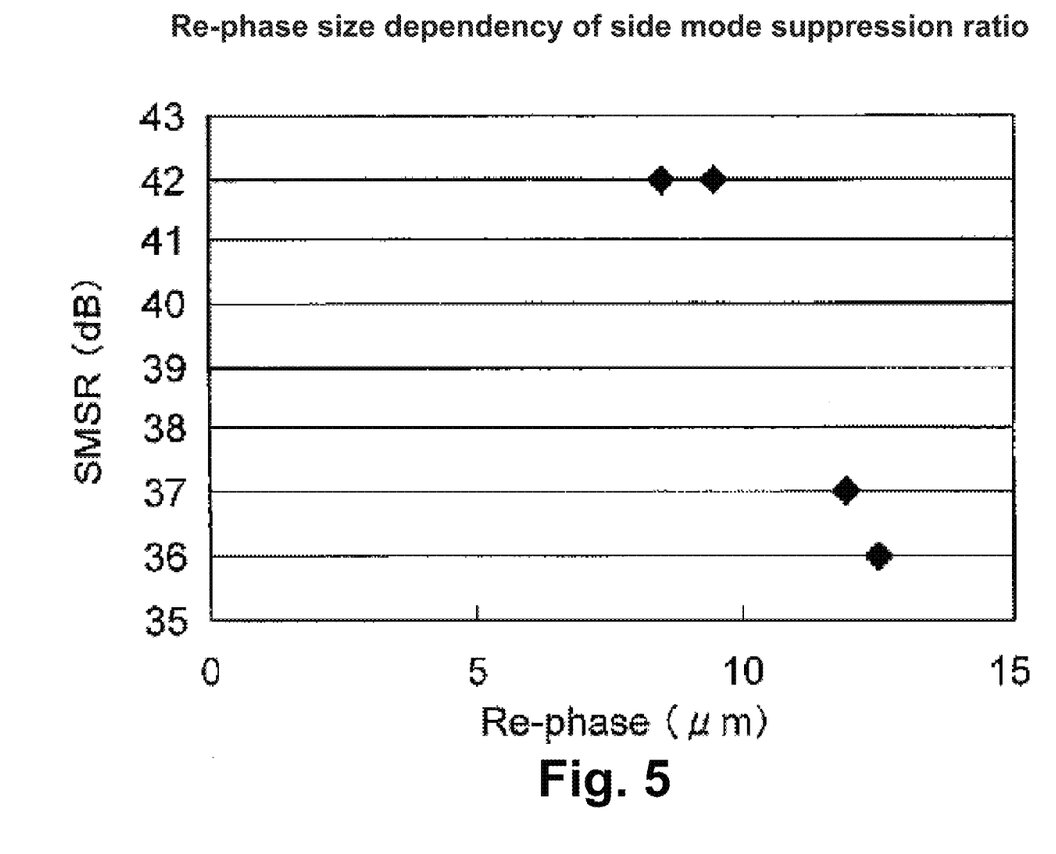
FIG. 5 is a graph which indicates the dependence of the side mode suppression ratio of the surface emitting laser shown in FIG. 1, on the diameter of the phase adjusting layer.
Figure 6:
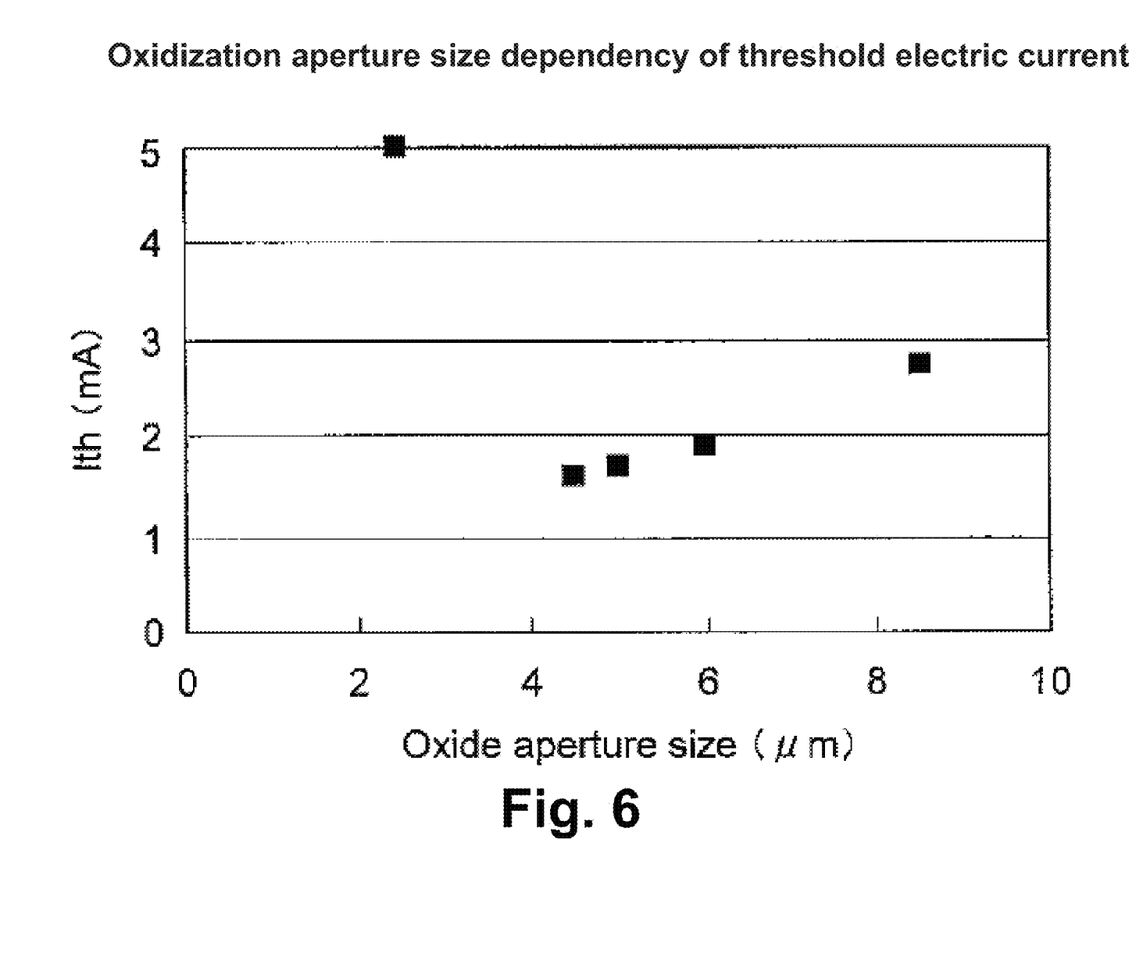
FIG. 6 is a graph which indicates the dependence of the threshold electric current of the surface emitting laser shown in FIG. 1, on the diameter of the oxidization aperture.
Figure 7:
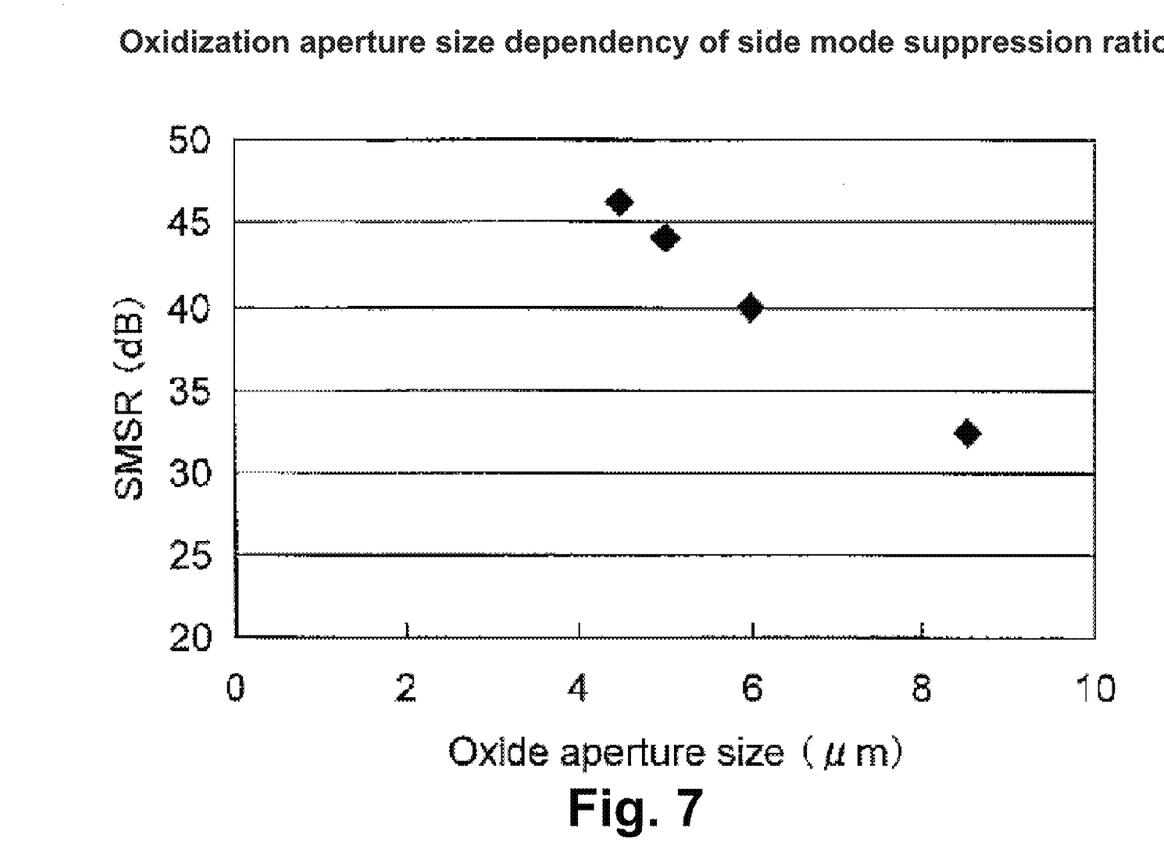
FIG. 7 is a graph which indicates the dependence of the side mode suppression ratio of the surface emitting laser shown in FIG. 1, on the diameter of the oxidization aperture.

FIGS. 3-7 indicate the result obtained by performing the above-mentioned experiment. FIGS. 3-5 indicate the changes in laser characteristics when the diameter of the phase adjusting layer 36 is changed, and the drawings indicate the dependence of the threshold electric current on the diameter of the phase adjusting layer, the dependence of the slope efficiency on the diameter of the phase adjusting layer, and the dependence of the side mode suppression ratio on the diameter of the phase adjusting layer, respectively. FIGS. 6 and 7 indicate the dependence of the threshold electric current on the diameter of the oxidization aperture and the dependence of the side mode suppression ratio on the diameter of the oxidization aperture when the diameter of the phase adjusting layer is fixed.

As is clear from FIGS. 3 to 7, the following information can be obtained from the above experiment. When the diameter of the phase adjusting layer 36 is greater than the diameter of the oxidization aperture 20a by 2.5 μm or more, the value of the threshold electric current becomes less, which is preferable (FIG. 3). The larger the diameter of the phase adjusting layer 36, the higher slope efficiency, and it gets saturated when the diameter of the phase adjusting layer 36 is greater than the diameter of the oxidization aperture 20a by about 6.5 μm (FIG. 4). The smaller the diameter of the phase adjusting layer 36, the side mode suppression ratio (SMSR) improves, and it becomes worse when the diameter of the phase adjusting layer 36 is greater than the diameter of the oxidization aperture 20a by 6.0 μm or more (FIG. 5). The threshold electric current is minimum when the diameter of the oxidization aperture 20a is 4.5 to 6.0 μm (FIG. 6). The smaller the diameter of the oxidization aperture 20a, the SMSR is better, and it becomes worse especially when the diameter of the oxidization aperture 20a is 6.0 μm or more (FIG. 7).

The phase adjusting layer is consisted of dielectric film, and it is preferable if its refractive index is less than the semiconductor layer abut with it and higher than the dielectric film internally adjoining the lamination surface.

As a result of the above experiment, in the surface emitting laser in which the layer including the topmost portion of the upper DBR mirror comprises of dielectric multi-layer film, it became clear that the good laser characteristics result if the diameter of the phase adjusting layer is greater than the diameter of the electric current constricting layer by 2.5 μm to 6.0 μm. Similar experiments were performed in the surface emitting laser with other oscillation wavelength and their relation was verified, and it was concluded that when the opening diameter X (μm) of the electric current constricting layer of the surface emitting laser element has the following relation with the diameter Y (μm) of the above-mentioned phase adjusting layer, it results in preferred laser characteristics: $X+1.9\lambda \leq Y \leq X+5.0\lambda$ (wherein λ indicates oscillation wavelength (μm) of the surface emitting laser)

In detail, it was also confirmed that the following structure is preferred.

(1) Thickness of the Oxidized Constricting Layer

Preferably, it is between 10 to 60 nm. This is because, in order to achieve a practical oxidization rate from the point of view of efficiency in manufacturing, the layer thickness has to be 10 nm or more. Also, from point of view of single mode characteristics, the layer thickness is preferably 60 nm or less.

(2) Position of the Electric Current Constricting Layer

It is best to position it at the node of standing wave of the oscillation laser light. However, it is still good even if it is displaced in the direction of the lamination by approximately $\pm(1/5)\times\lambda/(4N)$ when it is assumed that the average refractive index of the optical resonator that has lower multi-layer mirror and upper multi-layer mirror is N and the oscillation wavelength is λ. The permitted amount of this dislocation is approximately ±20 nm when the thickness of the oxidized constricting layer is approximately 20 nm in the VCSEL with wavelength 1300 nm.

(3) Diameter of the Oxidization Aperture (a) 3.5 to 7.0 μm is preferred for the surface emitting laser with wavelength 1000 nm band. From the point of view of single mode characteristics, 3.5 to 7.0 μm is preferred.

(b) 4.5 to 9.0 μm is preferred in the surface emitting laser with wavelength 1300 nm band. From the point of view of single mode characteristics, 4.5 to 6.5 μm is preferred.

(c) 5.5 to 11.0 μm is preferred in the surface emitting laser with wavelength 1550 nm band. From the point of view of single mode characteristics, 5.5 to 8.0 μm is preferred.

In the surface emitting laser of the present invention, when using the GaAs substrate as a substrate, it is preferable if the active layer comprises quantum well structure which includes the quantum well layer and the barrier layer comprised of semiconductor selected from the group consisting of GaInNAs, GaInNAsSb, GaAsSb and InGaAs. When the substrate is InP substrate, it is preferable if the active layer comprises quantum well structure which includes the quantum well layer and the barrier layer comprised of semiconductor selected from the group consisting of GaInAsP, AlGaInAs and GaInNAsSb. When the substrate is either of GaAs or InP substrate, the active layer may also be configured with the structure which includes quantum dot layer comprising InAs or InGaAs. In any cases, the number of the quantum well and the thickness of quantum well layer and barrier layer can be appropriately adjusted depending on the desired laser characteristic.

In the surface emitting laser of the present invention, the layer which includes the topmost portion of the upper DBR mirror may be comprised of dielectric multi-layer film mirror, and other layers may be comprised of semiconductor multi-layer film mirror comprised of pair of layers that include the layer with a high refractive index and the layer with a low refractive index. In such cases, the phase adjusting layer is preferably formed between the lamination of the dielectric multi-layer film and the lamination of the semiconductor multi-layer film, i.e., such that it abuts with the lowermost layer of the lamination of the dielectric multi-layer film. Other layers may be made to reside between the layer with a high refractive index and the layer with a low refractive index.

A plurality of surface emitting laser arrays according to the present invention may be placed in one dimensional or two-dimensional arrays. In such cases, one dimensional or two-dimensional array structure of the surface emitting lasers can be easily attained.

In accordance with the present invention, high-power output operations can be performed at a high temperature with a low threshold electric current while maintaining single mode of the surface emitting laser, and thereby, surface emitting lasers having practical characteristics can be provided.

In the above configuration, if the upper DBR mirror includes the layer comprised of dielectric multi-layer film, it is preferable if the phase adjusting layer is abut with the lowermost layer of the dielectric multi-layer film. It is preferable if at least one electric current constricting layer is provided on the side of p-type semiconductor lamination with respect to the active layer.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface emitting semiconductor laser comprising:
a substrate;
a lower distributed Bragg reflector mirror formed on the substrate with a multilayer semiconductor film;
a lower cladding layer formed on the lower distributed Bragg reflector mirror;
a lower contact layer formed on the lower cladding layer;
an active layer formed on the lower contact layer;
a current constricting layer formed on the active layer with a predetermined aperture diameter;
an upper cladding layer formed on the current constricting layer;
an upper contact layer formed on the upper cladding layer;

a phase adjusting layer formed on the upper contact layer with a predetermined diameter; and an upper distributed Bragg reflector mirror formed on the phase adjusting layer, wherein the predetermined aperture diameter of the current constricting layer and the predetermined diameter of the phase adjusting layer satisfy $X+1.9\lambda \leqq Y \leqq X+5.0\lambda$ wherein X is the aperture diameter of the current constricting layer in micrometers, Y is the diameter of the phase adjusting layer in micrometers, and $\lambda$ is an oscillation wavelength of the surface emitting semiconductor laser in micrometers.

2. The surface emitting semiconductor laser according to claim 1, wherein the substrate is a gallium arsenide substrate, and the active layer has a quantum well structure including quantum well layer and a barrier layer of semiconductors selected from a group consisting of gallium indium nitride arsenide, gallium indium nitride arsenide antimon, gallium arsenide antimon, and indium gallium arsenide.

3. The surface emitting semiconductor laser according to claim 1, wherein the substrate is an indium phosphide substrate, and the active layer has a quantum well structure including quantum well layer and a barrier layer of semiconductors selected from a group consisting of gallium indium arsenide phosphide, aluminum gallium indium arsenide, and gallium indium nitride arsenide antimon.

4. The surface emitting semiconductor laser according to claim 1, wherein the substrate is either a gallium arsenide substrate or an indium phosphide substrate, and the active layer has a quantum dot layer of semiconductor selected from a group consisting of indium arsenide, indium gallium arsenide, and gallium indium nitride arsenide.

5. The surface emitting semiconductor laser according to claim 1, wherein at least a layer including a top portion of the upper distributed Bragg reflector mirror is formed with a dielectric multi-layer film.

6. A surface emitting semiconductor laser array including a one-dimensional or two-dimensional array of the surface emitting semiconductor laser according to claim 1.

* * * * *